United States Patent
Shimabukuro

(10) Patent No.: US 10,193,040 B2
(45) Date of Patent: Jan. 29, 2019

(54) LED PACKAGE WITH A PLURALITY OF LED CHIPS

(71) Applicant: ROHM CO., LTD., Kyoto (JP)

(72) Inventor: Riki Shimabukuro, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 15/797,243

(22) Filed: Oct. 30, 2017

(65) Prior Publication Data

US 2018/0182945 A1  Jun. 28, 2018

(30) Foreign Application Priority Data

Dec. 22, 2016  (JP) .................................. 2016-249828

(51) Int. Cl.
  *H01L 33/62*  (2010.01)
  *H01L 33/38*  (2010.01)
  *H01L 27/15*  (2006.01)

(52) U.S. Cl.
  CPC .............. *H01L 33/62* (2013.01); *H01L 27/15* (2013.01); *H01L 33/382* (2013.01); *H01L 2224/48227* (2013.01); *H01L 2224/48465* (2013.01); *H01L 2224/49107* (2013.01); *H01L 2224/73265* (2013.01)

(58) Field of Classification Search
  CPC .......... H01L 33/00; H01L 33/08; H01L 33/62
  See application file for complete search history.

(56) References Cited

U.S. PATENT DOCUMENTS

| 7,391,118 | B2 * | 6/2008 | Tsai ........................ | H01L 25/16 257/777 |
| 9,847,463 | B2 * | 12/2017 | Kamada ................ | H01L 33/486 |
| 2010/0320592 | A1 * | 12/2010 | Takano ................ | H01L 21/565 257/692 |

FOREIGN PATENT DOCUMENTS

JP  2008-041699  2/2008

* cited by examiner

*Primary Examiner* — Quoc Hoang
(74) *Attorney, Agent, or Firm* — Hamre, Schumann, Mueller & Larson, P.C.

(57) ABSTRACT

An LED package includes a substrate having a substrate main surface and a substrate back surface, which face opposite sides in a thickness direction, a main surface electrode which is disposed on the substrate main surface and includes a first pad and a first die pad separated from each other, a first LED chip which is mounted on the first die pad and has an electrode pad formed on a first chip main surface facing the same direction as the substrate main surface, and a first wire connecting the first pad and the electrode pad. The first pad has a first base portion and a first pad portion having one end connected to the first base portion. The first pad portion of the first pad extends from the first base portion toward the first die pad obliquely.

20 Claims, 12 Drawing Sheets

LED PACKAGE WITH A PLURALITY OF LED CHIPS

CROSS-REFERENCE TO RELATED APPLICATION

This application is based upon and claims the benefit of priority from Japanese Patent Application No. 2016-249828, filed on Dec. 22, 2016, the entire contents of which are incorporated herein by reference.

TECHNICAL FIELD

The present disclosure relates to an LED package with a plurality of LED chips.

BACKGROUND

For example, in the related art, an LED package with a plurality of LED chips (a so-called multi-chip package) has been disclosed. In the disclosed LED package, the plurality of LED chips is mounted on metal leads. In addition, the LED package includes a resin molded body that accommodates these LED chips and holds the metal leads. The plurality of LED chips emits red light, blue light and green light. Various colors of light are emitted from the LED package having such a plurality of LED chips by adjusting an applied voltage.

Further miniaturization of an LED package is required due to a request for further downsizing of electronic equipment in recent years. However, in the LED package disclosed in the related art, the plurality of LED chips and wires (gold wires) connected to the LED chips are arranged in two directions. In order to miniaturize the LED package in such arrangement, the LED chips have to be miniaturized, so that there is a concern that output (luminance) of the LED package may decrease.

SUMMARY

Some embodiments of the present disclosure provide an LED package capable of achieving both high output and downsizing of the LED package.

According to one embodiment of the present disclosure, there is provided an LED package including a substrate having a substrate main surface and a substrate back surface, which face opposite sides in a thickness direction, a main surface electrode which is disposed on the substrate main surface and includes a first pad and a first die pad separated from each other, a first LED chip which is mounted on the first die pad and has an electrode pad formed on a first chip main surface facing the same direction as the substrate main surface, and a first wire connecting the first pad and the electrode pad. The substrate main surface has a first side along a first direction perpendicular to the thickness direction of the substrate and a second side along a second direction perpendicular to both the thickness direction of the substrate and the first direction. The first pad has a first base portion in contact with both the first side and the second side of the substrate main surface, and a first pad portion having one end connected to the first base portion. The first pad portion of the first pad extends from the first base portion toward the first die pad, obliquely with respect to both the first direction and the second direction.

The first wire is disposed along a direction in which the first pad portion of the first pad extends, when viewed in the thickness direction of the substrate.

The first die pad has a circular shape when viewed in the thickness direction of the substrate.

The first LED chip has a first chip back surface facing a side opposite to the first chip main surface in the thickness direction of the substrate, and the first chip back surface is mounted on the first die pad via a first bonding layer having conductivity.

The main surface electrode further includes a second pad and a second die pad connected to each other. The LED package further includes a second LED chip which is mounted on the second die pad and has a first electrode pad formed on a second chip main surface facing the same direction as the substrate main surface, and a second wire connecting the second pad and the first electrode pad. The second pad has a second base portion in contact with the first side of the substrate main surface, and a second pad portion having one end connected to the second base portion. The second pad portion of the second pad extends along the second direction.

The second wire is disposed along the first wire when viewed in the thickness direction of the substrate.

The second die pad has a rectangular shape when viewed in the thickness direction of the substrate.

The main surface electrode further includes a first connection wiring connecting the second pad and the second die pad. The first connection wiring has a first extending portion having one end extending from the second base portion of the second pad along the first direction, and a second extending portion extending from the other end of the first extending portion to one side of the second die pad along the second direction.

The first electrode pad is disposed close to an edge of the second LED chip when viewed in the thickness direction of the substrate. The second die pad has a main pad portion on which the second LED chip is mounted, and a sub pad portion which is integrally formed with the main pad portion and projects from the main pad portion in a direction from the center of the second LED chip to the center of the first electrode pad when the thickness direction of the substrate.

The main surface electrode further includes a third pad separated from both the first pad and the second pad. The second LED chip has a second electrode pad which is formed on the second chip main surface and is separated from the first electrode pad, the LED package further including a third wire which is disposed along the second wire when viewed in the thickness direction of the substrate and connects the third pad and the second electrode pad.

The second LED chip has a second chip back surface facing a side opposite to the second chip main surface in the thickness direction of the substrate. The second chip back surface is mounted on the second die pad via a second bonding layer having electrical insulation.

The substrate main surface has a third side along the second direction, the third side being positioned on a side opposite to the second side in the first direction. The main surface electrode further includes a second connection wiring having a third base portion in contact with both the first side and the third side of the substrate main surface, a first branch portion which is disposed along the second direction and connects the third base portion and the third pad, and a second branch portion which is disposed along the first direction and connects the third pad and the first die pad.

The LED package further includes a housing which is mounted on the substrate main surface and surrounds the first LED chip and the second LED chip, wherein the housing is filled with transparent seating resin.

The main surface electrode includes a Cu layer in contact with the substrate main surface, and an Ag layer laminated on the Cu layer.

Two second LED chips are provided, and the first LED chip emits red light, one of the two second LED chips emits blue light, and the other second LED chip emits green light. The LED package further includes a back surface electrode disposed on the substrate back surface, and a through-electrode connecting the main surface electrode and the back surface electrode, wherein the through-electrode is disposed along a through-groove which penetrates through the substrate and intersects an edge of the first base portion of the first pad.

Other features and advantages of the present disclosure will become more apparent from the following detailed description in conjunction with the accompanying drawings.

DETAILED DESCRIPTION

Figure 1:
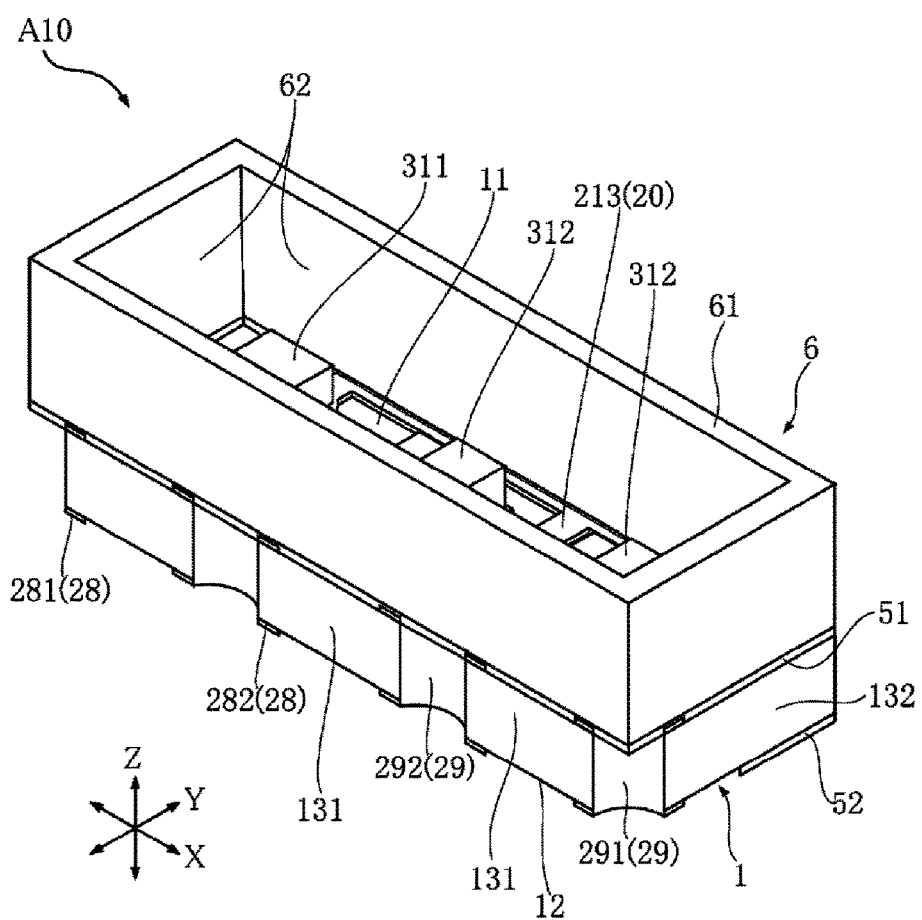
FIG. 1 is a perspective view of an LED package according to a first embodiment of the present disclosure, in which a sealing resin is penetrated.

Modes for carrying out the present disclosure (hereinafter referred to as "embodiments") will be now described with reference to the accompanying drawings.
[First Embodiment]

An LED package A10 according to a first embodiment of the present disclosure will be described below with reference to FIGS. 1 to 13. The LED package A10 includes a substrate 1, a main surface electrode 20, a back surface electrode 28, a through-electrode 29, a first LED chip 311, two second LED chips 312, a first wire 41, a second wire 42, a third wire 43, a main surface insulating film 51, a back surface insulating film 52, a housing 6 and a sealing resin 7.

Figure 2:
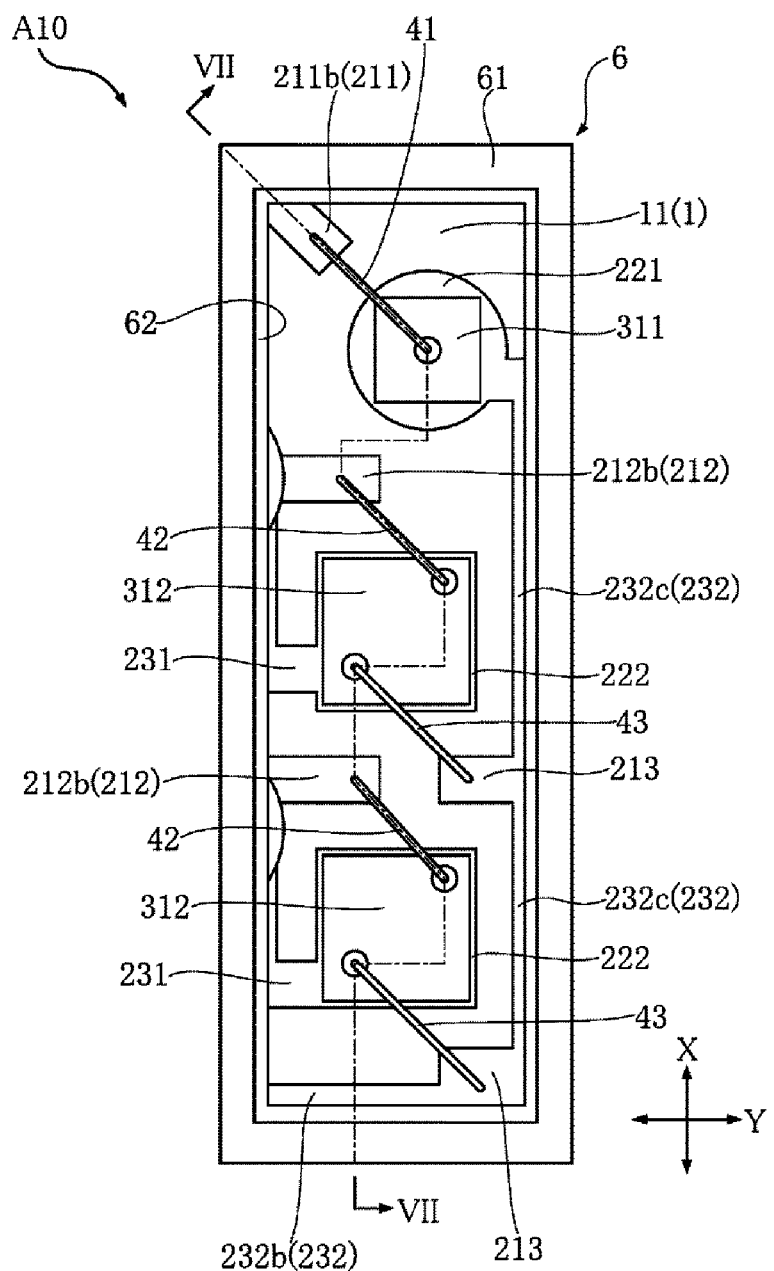
FIG. 2 is a plan view of the LED package shown in FIG. 1, in which a sealing resin is penetrated.
Figure 3:
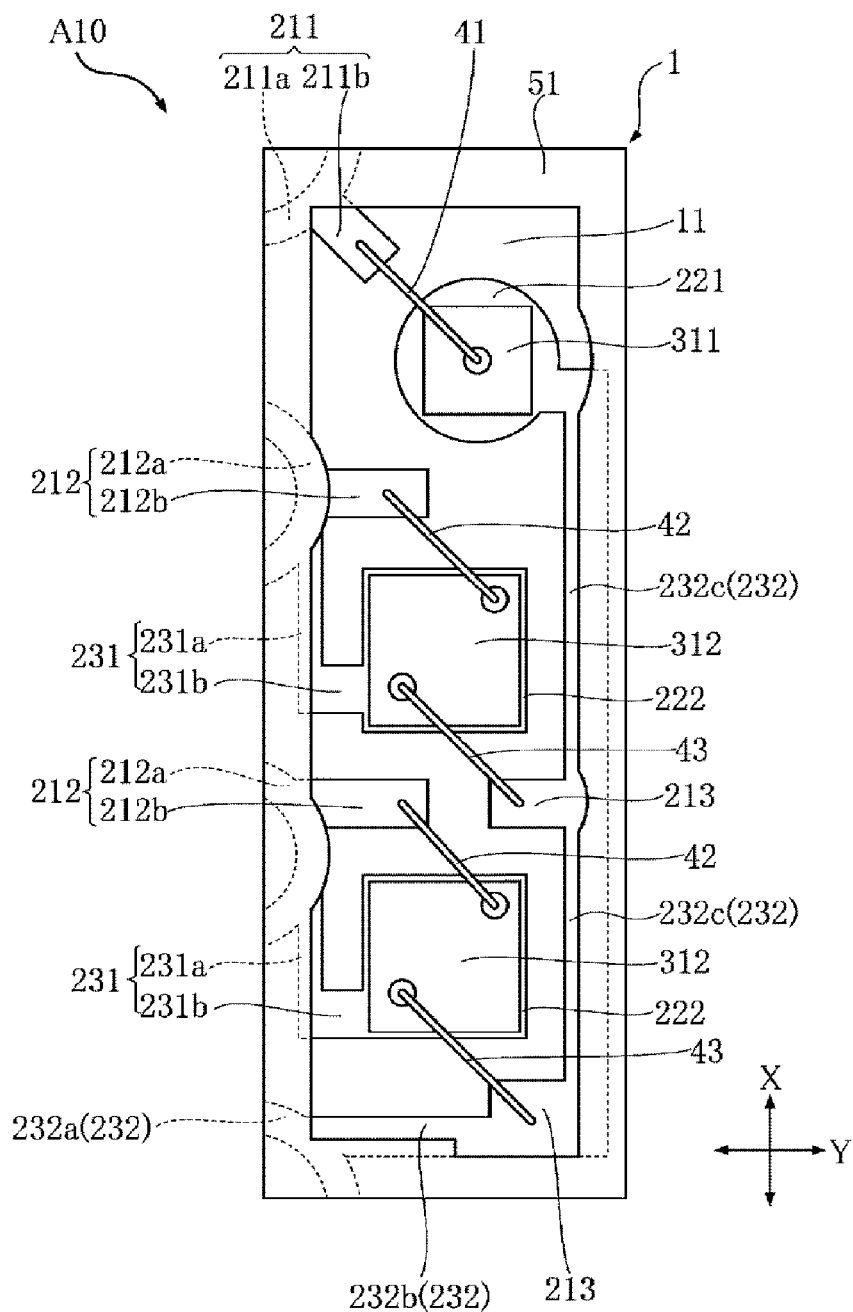
FIG. 3 is a plan view of the LED package in which a housing and a sealing resin are omitted from FIG. 2.
Figure 4:
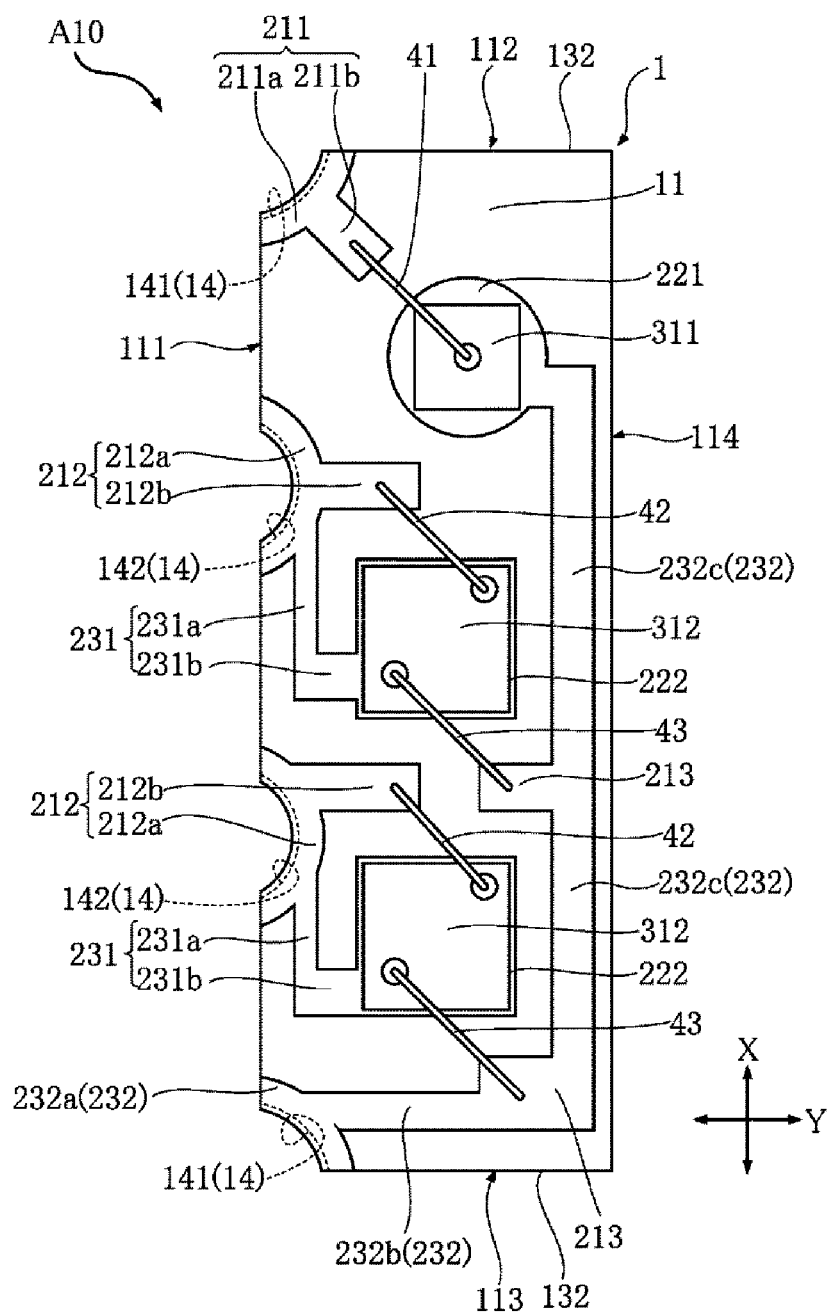
FIG. 4 is a plan view of the LED package in which a main surface insulating film is omitted from FIG. 3.
Figure 5:
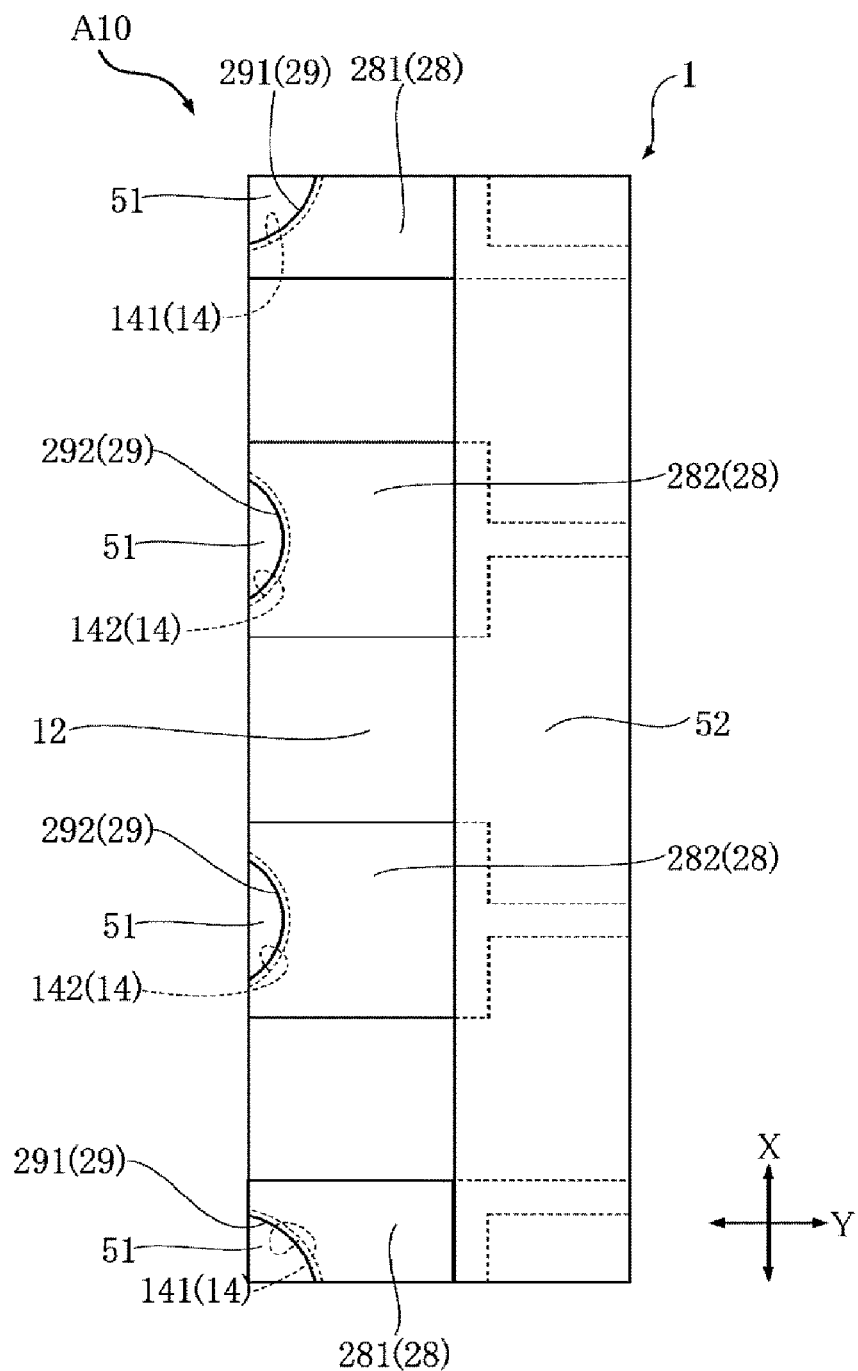
FIG. 5 is a bottom view of the LED package shown in FIG. 1.
Figure 6:
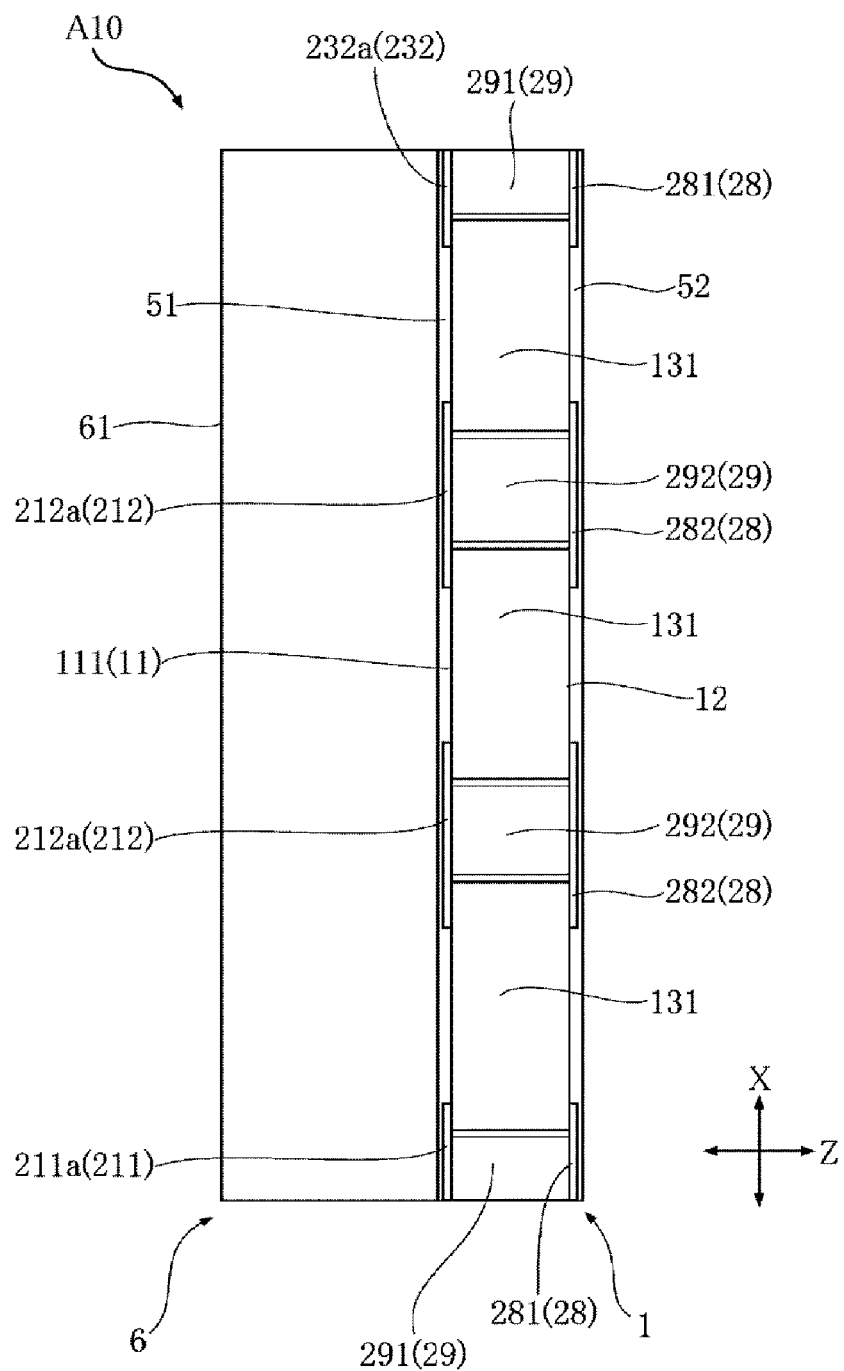
FIG. 6 is a front view of the LED package shown in FIG. 1.
Figure 7:
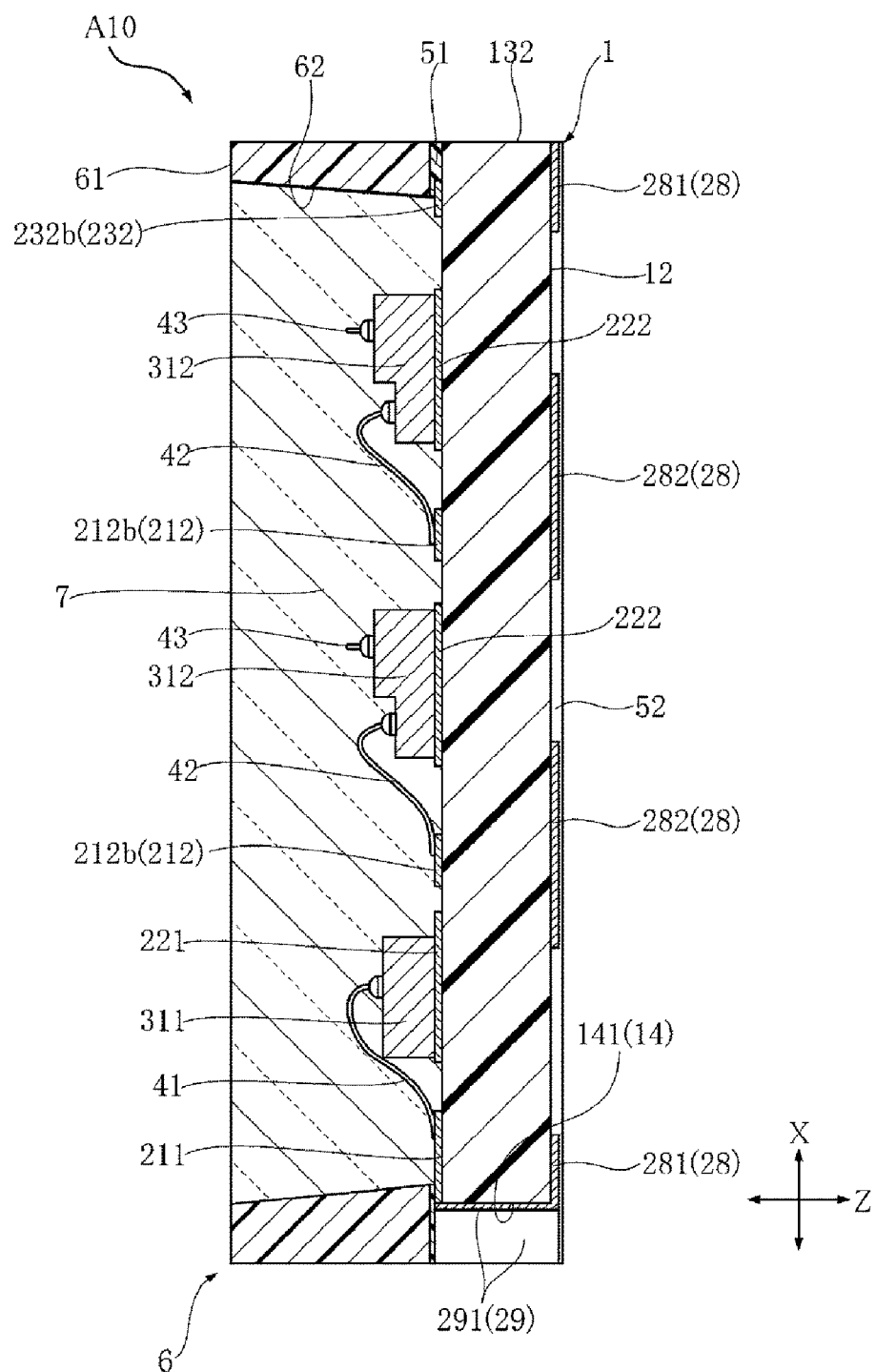
FIG. 7 is a cross-sectional view taken along line VII-VII in FIG. 2.
Figure 8:
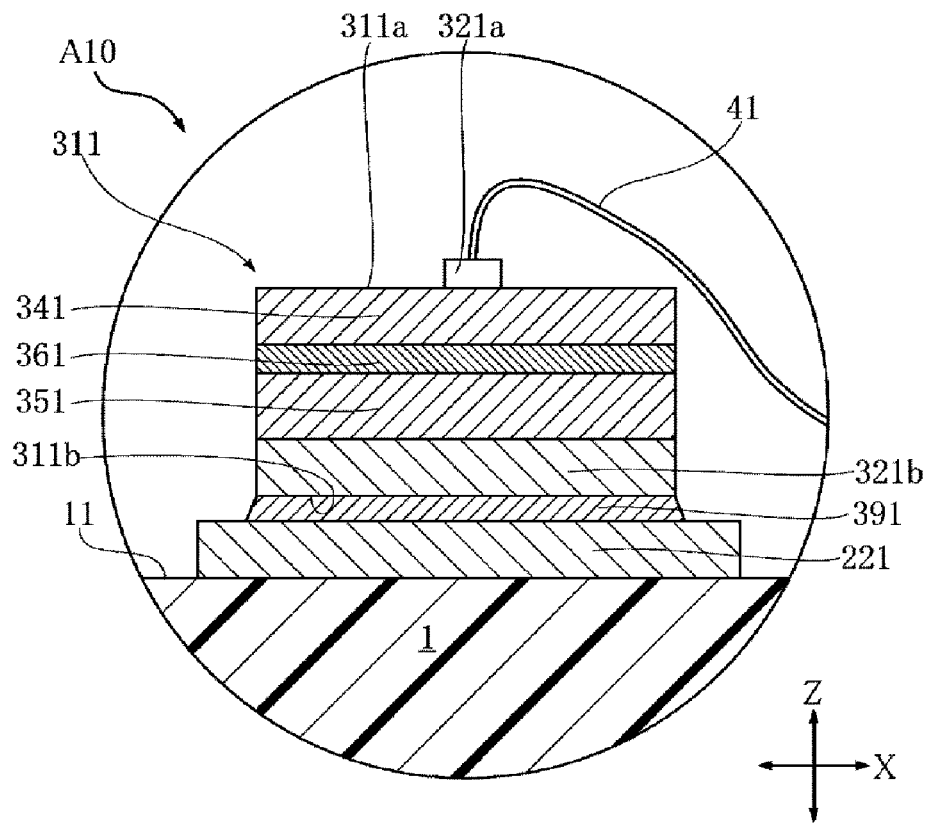
FIG. 8 is an enlarged cross-sectional view of a first LED chip shown in FIG. 7.
Figure 9:
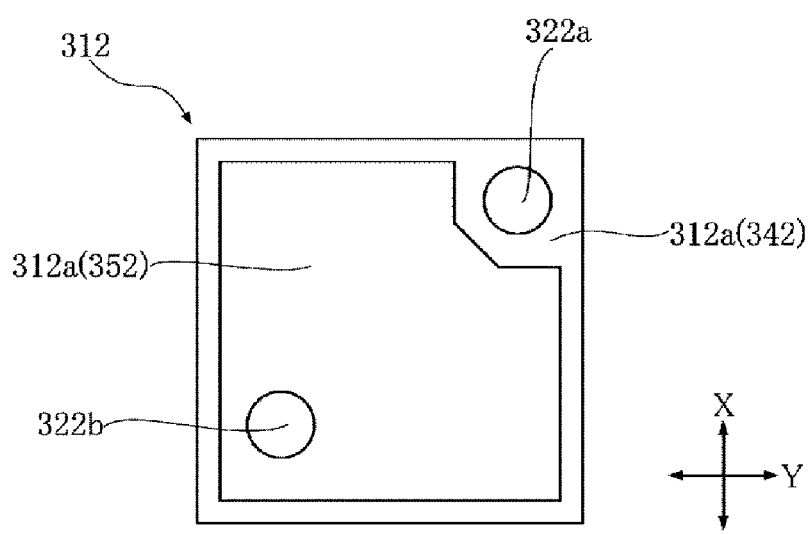
FIG. 9 is an enlarged plan view of a second LED chip shown in FIG. 2.
Figure 10:
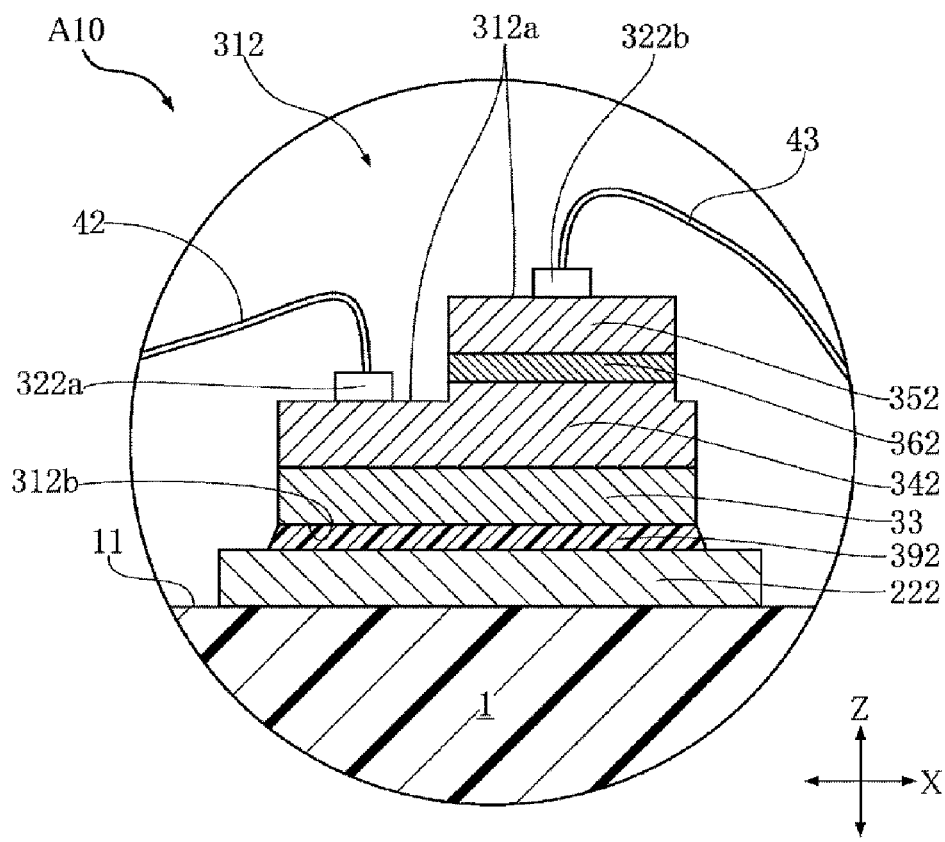
FIG. 10 is an enlarged cross-sectional view of a second LED chip shown in FIG. 7.

FIG. 1 is a perspective view of the LED package A10. FIG. 2 is a plan view of the LED package A10. For convenience of understandings. FIGS. 1 and 2 show the sealing resin 7 is penetrated. FIG. 3 is a plan view of the LED package A10 in which the housing 6 and the sealing resin 7 are omitted from FIG. 2. FIG. 4 is a plan view of the LED package A10 in which the main surface insulating film 51 is omitted from FIG. 3. FIG. 5 is a bottom view of the LED package A10. FIG. 6 is a front view of the LED package A10. FIG. 7 is a cross-sectional view taken along line (dashed line) in FIG. 2. FIG. 8 is an enlarged cross-sectional view of the first LED chip 311 shown in FIG. 7. FIG. 9 is an enlarged plan view of the second LED chip 312 shown in FIG. 2. FIG. 10 is an enlarged cross-sectional view of the second LED chip 312 shown in FIG. 7.

The LED package A10 shown in these figures is of a type that is surface-mounted on a circuit board of electronic equipment for use as an indicator etc. As shown in FIGS. 1 and 2, the shape of the LED package A10 in the thickness direction Z of the substrate 1 (hereinafter, simply referred to as the "thickness direction Z") is rectangular. Here, for convenience of description, the long side direction of the LED package A10, which is perpendicular to the thickness direction Z, is referred to as a first direction X. The short side direction of the LED package A10, which is perpendicular to both the thickness direction Z and the first direction X, is referred to as a second direction Y.

The substrate 1 is a member on which the first LED chip 311 and the two second LED chips 312 are mounted and which is used to mount the LED package A10 on a circuit board. The substrate 1 is made of an insulating material, such as glass epoxy resin or the like. As shown in FIGS. 4 and 5, the substrate 1 has a rectangular shape extending in the first direction X.

As shown in FIG. 1 and FIGS. 4 to 6, the substrate 1 has a substrate main surface 11, a substrate back surface 12, a first substrate side surface 131 and a pair of second substrate side surfaces 132. The substrate main surface 11 is one surface of the substrate 1 facing the thickness direction Z. The main surface electrode 20 on which the first LED chip 311 and the two second LED chips 312 are mounted is disposed on the substrate main surface 11. As shown in FIG. 4, the substrate main surface 11 has a first side 111, a second side 112, a third side 113 and a fourth side 114. The first side 111 and the fourth side 114 extend along the first direction X and are spaced apart from each other in the second direction Y. The second side 112 and the third side 113 extend along the second direction Y and are spaced apart from each other in the first direction X. Therefore, in the first direction X, the third side 113 is located on the opposite side to the second side 112. One end of the fourth side 114 intersects the second side 112 and the other side of the fourth side 114 intersects with the third side 113.

As shown in FIG. 5, the substrate back surface 12 is the other surface of the substrate 1 facing the thickness direction Z. Therefore, the substrate main surface 11 and the substrate back surface 12 face opposite sides in the thickness direction Z. The back surface electrode 28 is disposed on the substrate back surface 12.

As shown in FIG. 6, the first substrate side surface 131 is oriented in the first direction X and intersects the first side 111 of the substrate main surface 11 and the substrate back surface 12. Further, as shown in FIGS. 1 and 4, the pair of second substrate side surfaces 132 face opposite sides in the second direction Y. One second substrate side surface 132 faces the first direction X and intersects the second side 112 of the substrate main surface 11 and the substrate back surface 12. The other second substrate side surface 132 faces the first direction X and intersects the third side 113 of the substrate main surface 11 and the substrate back surface 12.

As shown in FIG. 4, a plurality of through-grooves 14 penetrating through the substrate 1 in the thickness direction Z is formed in the substrate 1. Each through-groove 14 is a so-called through-hole. The through-grooves 14 are firmed to extend from the substrate main surface 11 to the substrate back surface 12. Each of the through-grooves 14 includes a first through-groove 141 and a second through-groove 142. The through-electrode 29 is disposed on the inner wall of each of the through-grooves 14.

As shown in FIG. 4, the first through-groove 141 is a portion recessed from the first substrate side surface 131 and the second substrate side surface 132. The first through-groove 141 has a fan shape having a central angle of about 90 degrees when viewed in the thickness direction Z. The two first through-grooves 141 are separated from each other in the first direction X, one connected to the first side 111 and the second side 112 of the substrate main surface 11, and the other connected to the first side 111 and the third side 113 of the substrate main surface 11.

As shown in FIG. 4, the second through-groove 142 is a portion recessed from the first substrate side surface 131. The second through-groove 142 has a fan shape having a central angle of about 180 degrees when viewed in the thickness direction Z. The two second through-grooves 142 are positioned between the two first through-grooves 141 in the first direction X and are separated from each other. Both of the two second through-grooves 142 are connected to the first side 111 of the substrate main surface 11.

As shown in FIGS. 2 to 4, the main surface electrode 20 is a conductive member disposed on the substrate main surface 11 and on which the first LED chip 311 and the two second LED chips 312 are mounted, in order to supply electric power from the circuit board to the first LED chip 311 and the two second LED chips 312. The main surface electrode 20 includes a Cu layer in contact with the substrate main surface 11 and an Ag layer laminated on the Cu layer. The main surface electrode 20 may have a structure in which a Ni layer is interposed between the Cu layer and the Ag layer. The main surface electrode 20 includes a first pad 211, a first die pad 221, two second pads 212, two second die pads 222 and two first connection wirings 231. In addition, the main surface electrode 20 includes two third pads 213 and two second connection wirings 232.

As shown in FIGS. 3 and 4, the first pad 211 has a first base portion 211a and a first pad portion 211b. The first base portion 211a is a portion in contact with both the first side 111 and the second side 112 of the substrate main surface 11. In the present embodiment, the first base portion 211a has an annular shape with a central angle of about 90 degrees. The inner edge of the first base portion 211a intersects the first through-groove 141 connected to the first side 111 and the second side 112 of the substrate main surface 11. The first pad portion 211b has one end connected to the first base portion 211a and the other end connected to the first wire 41. In the present embodiment, the shape of the first pad portion 211b is rectangular. The first pad portion 211b extends from the first base portion 211a toward the first die pad 221 obliquely with respect to both the first direction X and the second direction Y.

As shown in FIGS. 2 to 4, the first LED chip 311 is mounted on the first die pad 221. The shape of the first die pad 221 is circular when viewed in the thickness direction Z. The second connection wiring 232 is connected to the first die pad 221.

As shown in FIGS. 3 and 4, the second pad 212 has a second base portion 212a and a second pad portion 212b. The second base portion 212a is a portion in contact with the first side 111 of the substrate main surface 11. In the present embodiment, the second base portion 212a has an annular shape with a central angle of about 180 degrees. The inner edge of the second base portion 212a intersects the second through-groove 142. The second pad portion 212b has one end connected to the second base portion 212a and the other end connected to the second wire 42. In the present embodiment, the shape of the second pad portion 212b is rectangular. The second pad portion 212b extends in the second direction Y.

As shown in FIGS. 2 to 4, the second LED chip 312 is mounted on the second die pad 222. The second die pad 222 has a rectangular shape when viewed in the thickness direction Z.

As shown in FIGS. 3 and 4, the first connection wiring 231 connects the second pad 212 and the second die pad 222. The first connection wiring 231 has a first extending portion 231a and a second extending portion 231b. The first extending portion 231a has one end extending from the second base portion 212a of the second pad 212 in the first direction X and having a rectangular shape. The second extending portion 231b extends from the other end of the first extending portion 231a to one side of the second die pad 222 in the second direction Y and has a rectangular shape. The first connection wiring 231 constituted by the first extending portion 231a and the second extending portion 231b has an L-like shape.

As shown in FIGS. 2 to 4, the third pad 213 is disposed in the vicinity of the fourth side 114 of the substrate main surface 11 so as to be separated from both the first pad 211 and the second pad 212. The third wire 43 is connected to the third pad 213. In the present embodiment, the shape of the third pad 213 is rectangular. One of the two third pads 213 is positioned in the vicinity of the intersection between the third side 113 and the fourth side 114 of the substrate main surface 11. The other third pad 213 is positioned between the two second die pads 222 in the first direction X and faces the second pad portion 212b of the second pad 212 in the second direction Y. The second connection wiring 232 is connected to each of the third pads 213.

As shown in FIGS. 3 and 4, the second connection wiring 232 has a third base portion 232a, a first branch portion 232b and a second branch portion 232c. The third base portion 232a is in contact with both the first side 111 and the third side 113 of the substrate main surface 11. In the present embodiment, the third base portion 232a has an annular shape with a central angle of about 90 degrees. The inner edge of the third base portion 232a intersects the first through-groove 141 connected to the first side 111 and the third side 113 of the substrate main surface 11. The first branch portion 232b is disposed in the vicinity of the third side 113 of the substrate main surface 11 in the second direction Y and connects the third base portion 232a and the above-mentioned one third pad 213. The second branch portion 232c is positioned in the vicinity of the fourth side 114 of the substrate main surface 11 in the first direction X and connects the two third pads 213 and the first die pad 221. In the present embodiment, both of the first branch portion 232b and the second branch portion 232c have an elongated strip shape. The second connection wiring 232 constituted by the third base portion 232a, the first branch portion 232b and the second branch portion 232c has an L-like shape.

As shown in FIG. 5, the back surface electrode 28 is a conductive member disposed on the substrate back surface 12 and used as an external terminal when the LED package A10 is mounted on the circuit board. The back surface electrode 28 makes electrical conduction with the main surface electrode 20 via the through-electrode 29 disposed on the inner wall of the through-groove 14. The back surface electrode 28 includes a Cu layer in contact with the substrate back surface 12 and a Sn-containing alloy layer laminated on the Cu layer. The back surface electrode 28 may have a structure in which a Ni layer is interposed between the Cu layer and the Sn-containing alloy layer. The back surface electrode 28 includes two first back surface electrodes 281 and two second back surface electrodes 282.

As shown in FIG. 5, an edge of each of the two first back surface electrodes 281 partially intersects the first through-groove 141. One of the two first back surface electrodes 281 makes electrical conduction with the first pad 211 via the through-electrode 29. The other first back surface electrode 281 makes electrical conduction with the first die pad 221 and the two third pads 213 via the through-electrode 29 and the second connection wiring 232. As shown in FIG. 5, an edge of each of the two second back surface electrodes 282 partially intersects the second through-groove 142. Each of the two second back surface electrodes 282 makes electrical conduction with the second pad 212 via the through-electrodes 29.

As shown in FIGS. 5 and 6, the through-electrode 29 is a conductive member, which is disposed along the inner wall of the through-groove 14 and connects the through-electrode 29 to the main surface electrode 20. The through-electrode 29 has the same elements as the back surface electrode 28. The through-electrode 29 includes two first through-electrodes 291 and two second through-electrodes 292.

As shown in FIGS. 5 and 6, the first through-electrodes 291 are disposed along the inner wall of the first through-groove 141. The first base portion 211a of the first pad 211 and the above-mentioned one first back surface electrode 281 are electrically connected to each other by one of the two first through-electrodes 291. The third base portion 232a of the second connection wiring 232 and the above-mentioned other first back surface electrode 281 are electrically connected to each other by the other one of first through-electrodes 291. As shown in FIGS. 5 and 6, the second through-electrodes 292 are disposed along the inner wall of the second through-groove 142. The second base portion 212a of the second pad 212 and the second back surface electrode 282 are electrically connected to each other by the second through-electrodes 292.

Both the first LED chip 311 and the two second LED chips 312 are light sources of the LED package A10. As shown in FIGS. 2 to 4, the first LED chip 311 and the two second LED chips 312 are arranged side by side along the first direction X. The first LED chip 311 is mounted on the first die pad 221. The two second LED chips 312 are mounted on the second die pad 222. In the present embodiment, the first LED chip 311 emits red light, one second LED chip 312 emits blue light and the other second LED chip 312 emits green light.

As shown in FIG. 8, the first LED chip 311 has a first chip main surface 311a and a first chip back surface 311b facing the thickness direction Z in the opposite sides. The first chip main surface 311a faces the same direction as the substrate main surface 11. The first chip back surface 311b faces the first die pad 221. As shown in FIG. 8, the first LED chip 311 includes an electrode pad 321a, a bottom electrode 321b, an n-type semiconductor layer 341, a p-type semiconductor layer 351 and an active layer 361.

The electrode pad 321a is formed on the first chip main surface 311a and is connected with the first wire 41. The bottom electrode 321b is located at the lower end of the first LED chip 311 shown in FIG. 8. A surface of the bottom electrode 321b, which faces the first die pad 221, corresponds to the first chip back surface 311b. The p-type semiconductor layer 351, the active layer 361 and the n-type semiconductor layer 341 are stacked in this order on the bottom electrode 321b shown in FIG. 8. A surface of the n-type semiconductor layer 341, which faces the same direction as the substrate main surface 11, corresponds to the first chip main surface 311a, The first LED chip 311 is mounted on the first die pad 221 by a first bonding layer 391, which is interposed between the first die pad 221 and first chip main surface 311a and has conductivity. The first bonding layer 391 is made of, e.g., synthetic resin mainly composed of epoxy resin containing Ag (a so-called Ag paste). Therefore, the bottom electrode 321b makes electrical conduction with the first die pad 221 via the first bonding layer 391.

When a forward bias voltage (a voltage at which the bottom electrode 321b has a high potential) is applied to the first LED chip 311, the active layer 361 emits light. Therefore, the bottom electrode 321b corresponds to an anode terminal of the first LED chip 311 and the electrode pad 321a corresponds to a cathode terminal of the first LED chip 311. Further, the n-type semiconductor layer 341, the p-type semiconductor layer 351 and the active layer 361 are set such that the first LED chip 311 emits red light.

As shown in FIG. 10, the second LED chip 312 has a second chip main surface 312a and a second chip back surface 312b, which face the thickness direction Z in the opposite sides. The second chip main surface 312a faces the same direction as the substrate main surface 11. The second chip back surface 3121 faces the second die pad 222. As shown in FIG. 10, the second LED chip 312 includes a first electrode pad 322a, a second electrode pad 322b, semiconductor substrate 33, an n-type semiconductor layer 342, a p-type semiconductor layer 352 and an active layer 362.

The semiconductor substrate 33 is located at the lower end of the second LED chip 312 shown in FIG. 10. The semiconductor substrate 33 is formed of, e.g., a sapphire ($Al_2O_3$) substrate or a Si substrate. A surface of the semiconductor substrate 33, which faces the second die pad 222, corresponds to the second chip back surface 312b. On the semiconductor substrate 33 shown in FIG. 10, the n-type semiconductor layer 342 is stacked and the active layer 362 and the p-type semiconductor layer 352 are further stacked in this order so as to protrude from a portion of the n-type semiconductor layer 342. Surfaces of the n-type semiconductor layer 342 and the p-type semiconductor layer 352, which face the same direction as the substrate main surface 11, correspond to the second chip main surface 312a. Therefore, a step is generated in the second chip main surface 312a in the thickness direction Z. The first electrode pad 322a is formed in the second chip main surface 312a, which is a portion of the n-type semiconductor layer 342, and is connected with the second wire 42. As shown in FIG. 9, when viewed in the thickness direction Z, the first electrode pad 322a is disposed close to the edge of the second LED chip 312. The second electrode pad 322b is formed in the second chip back surface 312b, which is a portion of the p-type semiconductor layer 352, and is connected with the third wire 43. As shown in FIG. 9, the second electrode pad 322b is spaced apart from the first electrode pad 322a. The second LED chip 312 is mounted on the second die pad 222 by a second bonding layer 392, which is interposed between the second die pad 222 and the second chip main surface 312a and has electrical insulation properties. The second bonding layer 392 is composed of, e.g., a bonding agent such as silicon resin.

When a forward bias voltage (a voltage at which the second electrode pad 322b has a high potential) is applied to the second LED chip 312, the active layer 362 emits light. Therefore, the second electrode pad 322b corresponds to an anode terminal of the second LED chip 312 and the first electrode pad 322a corresponds to a cathode terminal of the second LED chip 312. Further, the n-type semiconductor layer 342, the p-type semiconductor layer 352 and the active layer 362 are set such that the second LED chip 312 emits blue or green light.

The first wire 41, the second wire 42 and the third wire 43 are conductive members for connecting the first LED chip 311 and the two second LED chips 312 to the main surface electrode 20. The first wire 41, the second wire 42 and the third wire 43 are formed by wire bonding. In the present embodiment, the first wire 41, the second wire 42 and the third wire 43 are made of, e.g., Au.

As shown in FIGS. 2 to 4, the first wire 41 is a conductive member for connecting the first pad portion 211b of the first pad 211 to the electrode pad 321a of the first LED chip 311. The electrode pad 321a makes electrical conduction with the first pad 211 via the first wire 41. When viewed in the thickness direction Z, the first wire 41 is disposed along a direction in which the first pad portion 211b of the first pad 211 extends.

As shown in FIGS. 2 to 4, the second wire 42 is a conductive member for connecting the second pad portion 212b of the second pad 212 to the first electrode pad 322a of the second LED chip 312. The second wire 42 is composed of two pieces. The first electrode pad 322a makes electrical conduction with the second pad 212 via the second wire 42. When viewed in the thickness direction Z, the second wire 42 is disposed along the first wire 41.

As shown in FIGS. 2 to 4, the third wire 43 is a conductive member for connecting the third pad 213 to the second electrode pad 322b of the second LED chip 312. The third wire 43 is composed of two pieces. The second electrode pad 322b makes electrical conduction with the third pad 213 via the third wire 43. When viewed in the thickness direction Z, the third wire 43 is disposed along the first wire 41.

Figure 11:
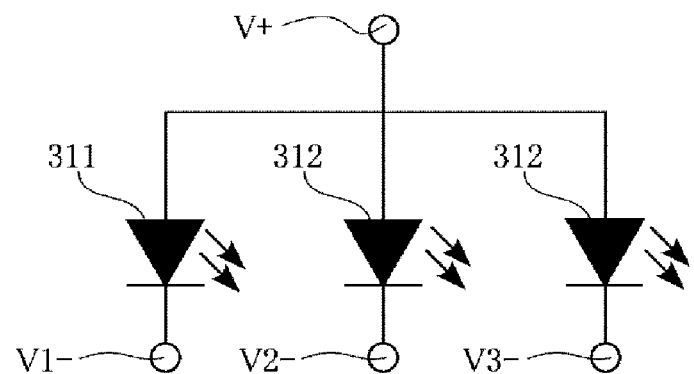
FIG. 11 is a circuit diagram of the LED package shown in FIG. 1.

FIG. 11 is a circuit diagram of the LED package A10. As shown in FIG. 11, the anode terminals of the first LED chip 311 and the two second LED chips 312 are connected to one positive electrode terminal V+ of the LED package A10. This circuit is a so-called anode common circuit. In the present embodiment, the positive electrode terminal V+ corresponds to the first back surface electrode 281 and the first through-electrode 291, which are electrically connected to the third base portion 232a of the second connection wiring 232. The cathode terminals of the first LED chip 311 and the two second LED chips 312 are respectively connected to three negative electrode terminals V1−, V2− and V3− of the LED package A10. In the present embodiment, the negative electrode terminal V1− corresponds to the first back surface electrode 281 and the first through-electrode 291, which are electrically connected to the first base portion 211a of the first pad 211. Further, each of the negative electrode terminals V2− and V3− correspond to the second back surface electrode 282 and the second through-electrode 292, which are electrically connected to the second base portion 212a of the second pad 212.

As shown in FIG. 3, the main surface insulating film 51 is a member that partially covers the main surface electrode 20 on the substrate main surface 11. The main surface insulating film 51 is a so-called solder resist. In the present embodiment, the main surface insulating film 51 is formed in a frame shape along the first side 111, the second side 112, the third side 113 and the fourth side 114 of the substrate main surface 11. The main surface insulating film 51 is provided to secure the bonding property between the substrate 1 and the housing 6 by a bonding agent while preventing the bonding agent from leaking into the through-groove 14.

As shown in FIG. 5, the back surface insulating film 52 is a member that partially covers the back surface electrode 28 on the substrate back surface 12. Like the main surface insulating film 51, the back surface insulating film 52 is a so-called solder resist. In the present embodiment, the back surface insulating film 52 is formed in a rectangular shape.

As shown in FIGS. 2 and 7, the housing 6 is a member that surrounds the first LED chip 311 and the two second LED chips 312. The housing 6 is made of, e.g., white synthetic resin having high mechanical strength and excellent heat resistance, such as Bismaleimide-Triazine resin (BT resin), Polyphthalamide (PPA) or polycarbonate. The housing 6 is bonded to the substrate main surface 11 via a bonding agent (not shown). The housing 6 has a top surface 61 and an inner peripheral surface 62.

As shown in FIGS. 2 and 7, the top surface 61 is a flat surface facing the same direction as the substrate main surface 11. The top surface 61 has a frame shape along the first side 111, the second side 112, the third side 113 and the fourth side 114 of the substrate main surface 11 shown in FIG. 4. The inner peripheral surface 62 is an inner surface connected to the top surface 61 and surrounding the first LED chip 311 and the two second LED chips 312. The inner peripheral surface 62 is inclined with respect to the substrate main surface 11.

As shown in FIG. 7, the sealing resin 7 is a member filled in the housing 6 and covering the first LED chip 311 and the two second LED chips 312. The sealing resin 7 is a transparent synthetic resin such as silicone resin. The sealing resin 7 may contain phosphors (not shown) that emit different wavelengths when excited by light emitted from the first LED chip 311 and the two second LED chips 312.

Figure 12:
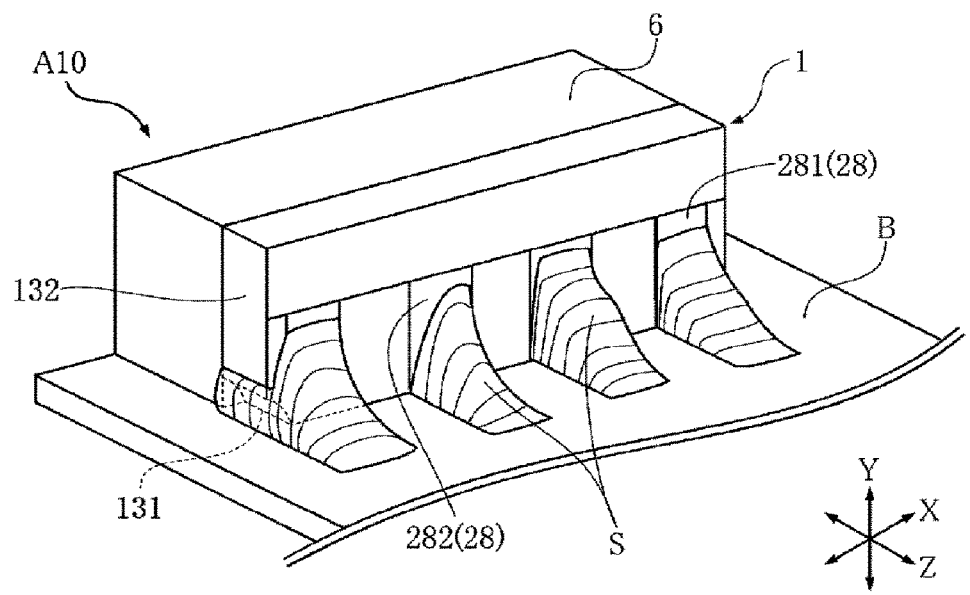
FIG. 12 is a perspective view of a mounting structure of the LED package shown in FIG. 1.
Figure 13:
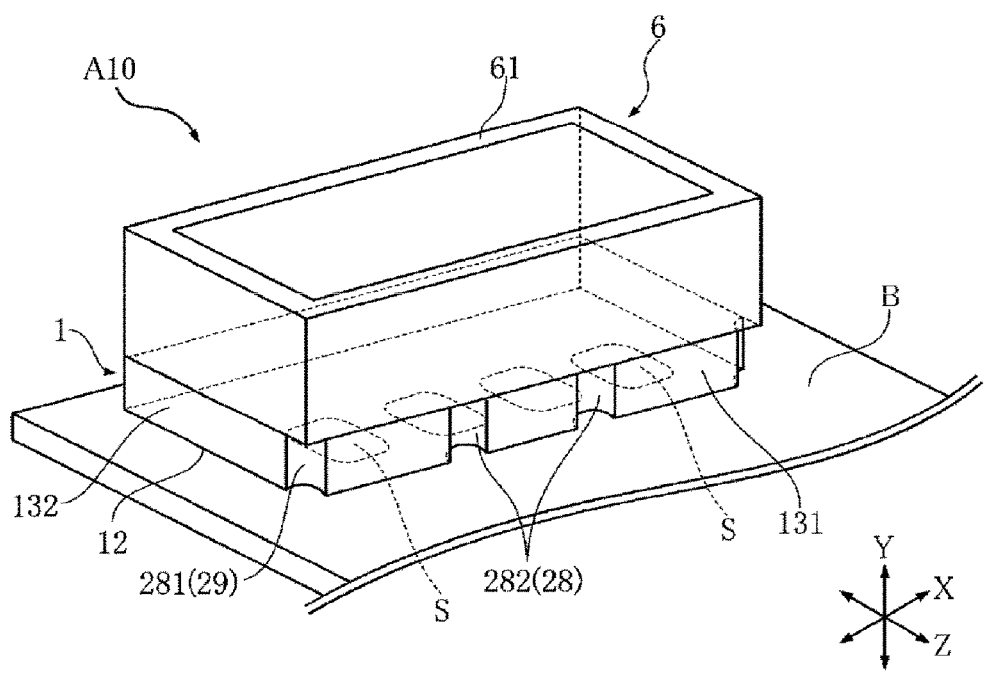
FIG. 13 is a perspective view of another mounting structure of the LED package shown in FIG. 1.

FIGS. 12 and 13 are perspective views of a mounting structure of the LED package A10. The mounting structure of the LED package A10 includes the LED package A10, a circuit board B and a solder S. The circuit board B is, for example, a printed wiring board. A wiring pattern (not shown) is formed on the circuit board B. The solder S is, for example, a cream solder and bonds the back surface electrode 28 of the LED package A10 to the wiring pattern of the circuit board B.

FIG. 12 shows a mounting structure of a side view type LED package A10. As shown in FIG. 12, the first substrate side surface 131 of the LED package A10 faces the circuit board B. In this case, light is emitted from the LED package A10 in a direction (here, the thickness direction Z) perpendicular to a direction (here, the second direction Y) that the circuit board B faces.

FIG. 13 shows a mounting structure of a top view type LED package A10. As shown in FIG. 13, the substrate back surface 12 of the LED package A10 faces the circuit board B. In this case, light is emitted from the LED package A10 in a direction (here, the thickness direction Z) that the circuit board B faces. In this way, the LED package A10 may take both of the mounting structures shown in FIGS. 12 and 13.

Next, the operations and effects of the LED package A10 will be described.

In the LED package A10 the first pad 211 to which the first wire 41 is connected has the first base portion 211a. in contact with both the first side 111 and the second side 112 of the substrate main surface 11, and the first pad portion 211b whose one end is connected to the first base portion 211a. The first pad portion 211b of the first pad 211 extends from the first base portion 211a toward the first die pad 221 on which the first LED chip 311 is mounted, obliquely with respect to both the first direction X and the second direction Y. When such a configuration is adopted, the first wires 41 connected to the first LED chips 311 can be disposed along a direction in which the first pad portions 211b extends. When the first LED chip 311 and the two second LED chips 312 are arranged side by side on the substrate main surface 11 along the first direction X, the second wire 42 and the third wire 43 connected to the second LED chip 312 can be also arranged along the first wire 41. Therefore, the arrangement space of the first wire 41, the second wire 42 and the third wire 43 in the LED package A10 is reduced. Accordingly, it is possible to increase the sizes of the first LED chip 311 and the two second LED chips 312 while reducing the size of the LED package A10, thereby achieving high output of the LED package A10. Therefore, it is possible to achieve both high output and downsizing of the LED package A10.

The two second LED chips 312 are so-called two-wire type elements, which are mounted on the second die pad 222 by the second bonding layer 392. The second die pad 222 is disposed close to the second pad 212 to which the second wire 42 is connected, and is connected to the second pad 212. Here, when the second LED chip 312 is mounted on the second die pad 222, the bonding agent constituting the second bonding layer 392 may be exuded from the second die pad 222. When the bonding agent exuded from the second die pad 222 reaches the second pad portion 212b of the second pad 212, the connection of the second wire 42 to the second pad 212 may be hindered. Therefore, by interposing the L-shaped first connection wiring 231 between the second pad 212 and the second die pad 222, it is possible to prevent the exuded bonding agent from reaching the second pad 212. In addition, the first connection wiring 231 is connected to the second base portion 212a of the second pad 212 but is not connected to the second pad portion 212b. Therefore, when the bonding agent is exuded from the second die pad 222, the bonding agent stagnates on the second base portion 212a, so that it is possible to prevent the bonding agent from reaching the second pad portion 212b. In particular, the second base portion 212a formed along the edge of the second through-groove 142 when viewed in the thickness direction Z can be easily increased in its area and is suitable for retaining the bonding agent.

The second pad portion 212b of the second pad 212 to which the second wire 42 is connected and the third pad 213 to which the third wire 43 is connected are both arranged so as to extend along the second direction Y. Such a configuration is suitable for disposing the second wire 42 and the third wire 43 along the first wire 41.

In addition, by the L-shaped second connection wiring 232 connecting two third pads 213 to each other, the third pad 213 can be disposed on the opposite side to the second pad 212 in the second direction Y. Such a configuration is suitable for disposing the second wire 42 and the third wire 43 along the first wire 41.

The LED package A10 includes the housing 6 mounted on the substrate main surface 11 and surrounding the first LED chip 311 and the two second LED chips 312. The housing 6 has the inner peripheral surface 62 surrounding these elements. Since the inner peripheral surface 62 functions as a reflector that reflects the light emitted from the first LED chip 311 and the two second LED chips 312, which contributes to higher output of the LED package A10. The main surface electrode 20 disposed on the substrate main surface 11 includes an Ag layer as an element. The Ag layer functions to protect the main surface electrode 20 from any impact which may occur when the first LED chip 311 or the like is mounted by die bonding or when the first wire 41 is connected to the first pad 211 or the like by wire bonding. Further, the Ag layer has an effect of improving efficiency of reflection of light emitted from the first LED chip 311 and the two second LED chips 312 inside the housing 6.

The housing 6 is filled with the transparent sealing resin 7. The sealing resin 7 has an effect of improving efficiency of extraction of light emitted from the first LED chip 311 and the two second LED chips 312, which contributes to higher output of the LED package A10.

The LED package A10 includes the back surface electrode 28 disposed on the substrate back surface 12, and the through-electrode 29 connecting the main surface electrode 20 and the back surface electrode 28. By taking such a configuration, when adopting the mounting structure of the LED package A10 shown in FIG. 12, the solder S can be attached to the back surface electrode 28 in a fillet form, which can improve the mountability of the LED package A10 on the circuit board B.

[Second Embodiment]

An LED package A20 according to a second embodiment of the present disclosure will now be described with reference to FIGS. 14 and 15. In these figures, the same or similar elements as those of the above-described LED package A10 are denoted by the same reference numerals and explanation of which will be omitted.

Figure 14:
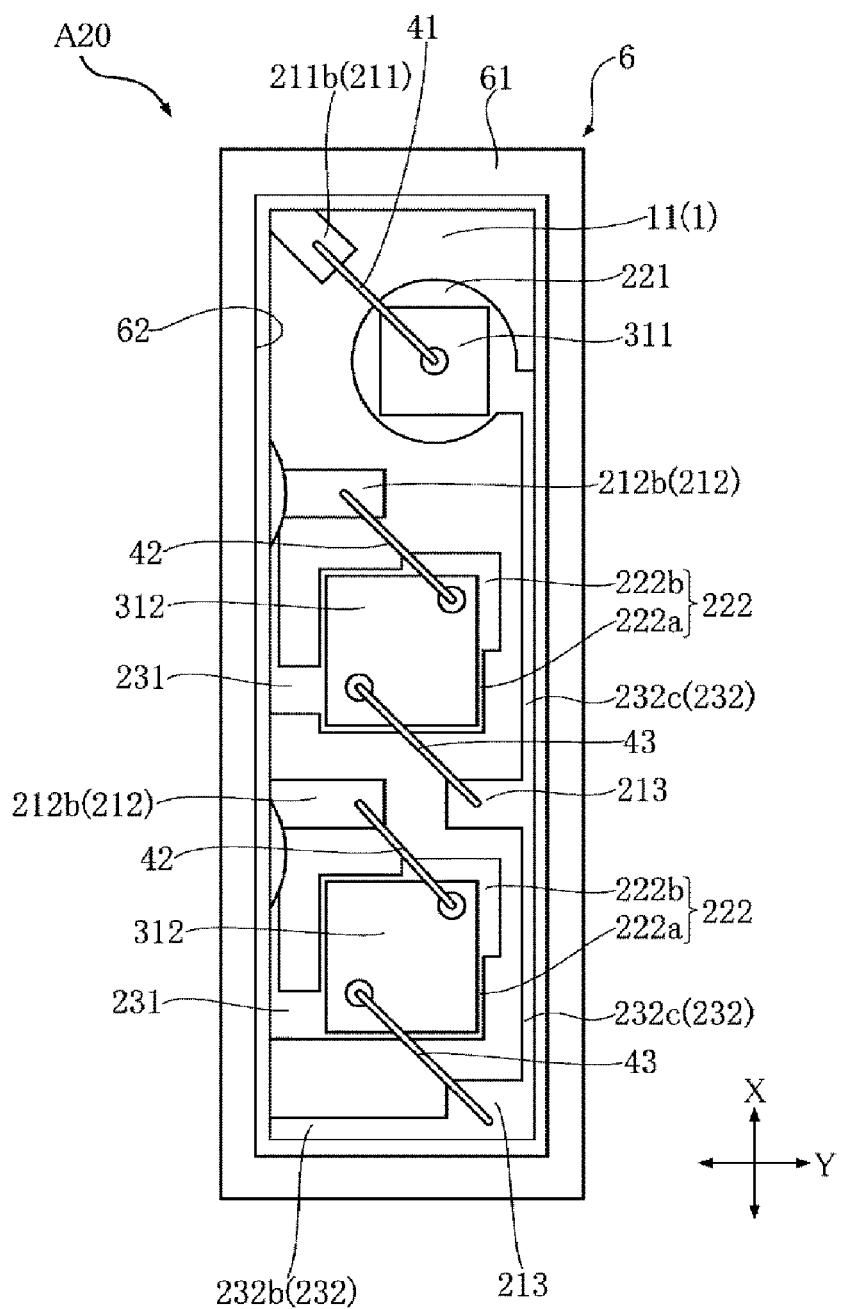
FIG. 14 is a plan view of an LED package according to a second embodiment of the present disclosure, in which a sealing resin is penetrated.

FIG. 14 is a plan view of the LED package A20, in which the sealing resin 7 is penetrated for the sake of understandings. FIG. 15 is an enlarged plan view of the second die pad 222 shown in FIG. 14.

The LED package A20 is different from the LED package A0 in the configuration of the second die pad 222 on which the second LED chips 312 are mounted.

Figure 15:
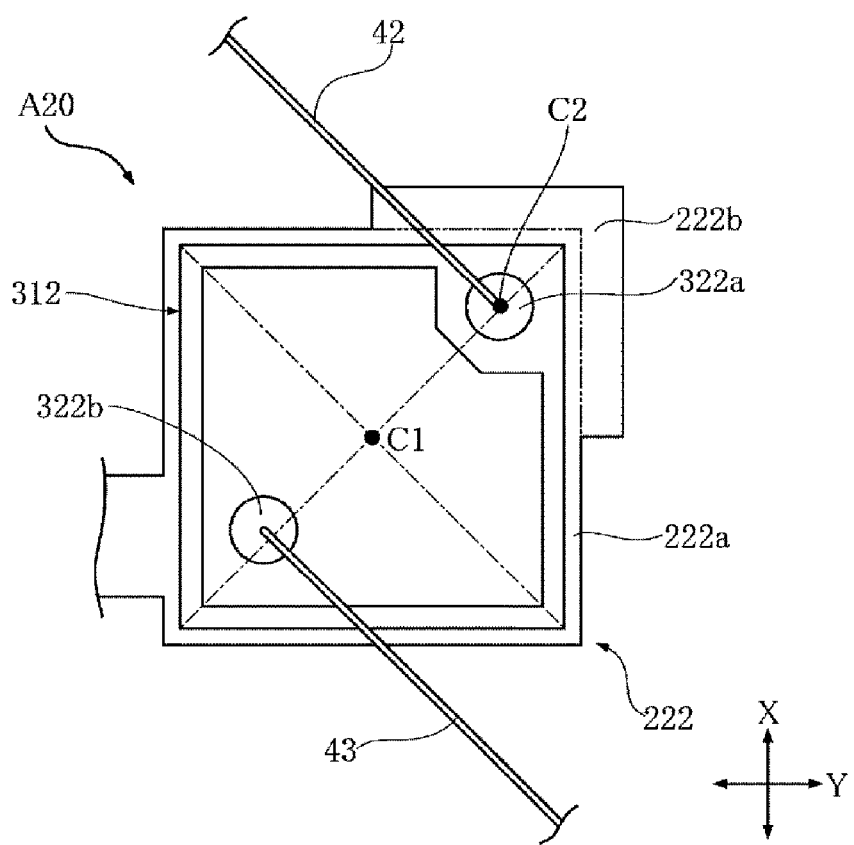
FIG. 15 is an enlarged plan view of a second die pad 222 shown in FIG. 14.

As shown in FIGS. 14 and 15, the second die pad 222 has a main pad portion 222a and a sub pad portion 222b. The main pad portion 222a is a portion on which the second LED chip 312 is mounted, and has a rectangular shape. The sub pad portion 222b is formed integrally with the main pad portion 222a and projects from the main pad portion 222a in a direction from the center C1 of the second LED chip 312 to the center C2 of the first electrode pad 322a when viewed in the thickness direction Z. The positions of the center C1 and the center C2 are shown in FIG. 15. The center C1 is an intersection of diagonal lines (dashed lines shown in FIG. 15) of the second LED chip 312 when viewed in the thickness direction Z. The center C2 is the center of a circle indicating the outer shape of the first electrode pad 322a when viewed in the thickness direction Z. For the sake of easy understandings, the boundary between the main pad portion 222a and the sub pad portion 222b is indicated by an imaginary line (a two-dot chain line) in FIG. 15. In this embodiment, the scab pad portion 222b has an L-like shape when viewed in the thickness direction Z. However, the outline of the sub pad portion 222b may be, for example, a circular arc.

Next, the operations and effects of the LED package A20 will be described.

Like the LED package A10, the first pad portion 211b of the first pad 211 of the LED package A20 extends from the first base portion 211a toward the first die pad 221, obliquely with respect to both the first direction X and the second direction Y. Therefore, the arrangement space of the first wire 41, the second wire 42 and the third wire 43 in the LED package A20 can be reduced and the sizes of the first LED chip 311 and the two second LED chips 312 can be increased. Therefore, as in the LED package A10, it is possible to achieve both high output and downsizing of the LED package A20.

The second die pad 222 on which the second LED chip 312 is mounted has the main pad portion 222a and the sub pad portion 222b. Here, when the second LED chip 312 is mounted on the second die pad 222 by die bonding, there may be a positional deviation by which the second LED chip 312 may not be mounted at a predetermined position of the second die pad 222. Therefore, by providing the sub pad portion 222b, even when the second LED chip 312 is mounted on the second die pad 222 in a state in which the positional deviation has occurred, the second die pad 222 can be positioned immediately below the first electrode pad 322a when viewed in the thickness direction Z. Therefore, when the second wire 42 is connected to the first electrode pad 322a by wire bonding, a bending stress due to a capillary pressed by the first electrode pad 322a does not occur in the second LED chip 312. Therefore, it is possible to prevent a mechanical load from being applied to the second LED chip 312 due to the bending stress.

The present disclosure is not limited to the above-described embodiments. The specific configurations of various parts or portions of the present disclosure can be modified in design in different ways.

According to the present disclosure in some embodiments, it is possible to achieve both high output and downsizing of an LED package.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An LED package comprising:
    a substrate having a substrate main surface and a substrate back surface, which face opposite sides in a thickness direction;
    a main surface electrode which is disposed on the substrate main surface, the main surface electrode including:
        a first pad and a first die pad separated from each other, and
        a second pad and a second die pad connected to each other;
    a first LED chip which is mounted on the first die pad and has an electrode pad formed on a first chip main surface facing the same direction as the substrate main surface;
    a first wire connecting the first pad and the electrode pad;
    a second LED chip which is mounted on the second die pad and has a first electrode pad formed on a second chip main surface facing the same direction as the substrate main surface; and
    a second wire connecting the second pad and the first electrode pad,
    wherein the substrate main surface has a first side along a first direction perpendicular to the thickness direction of the substrate and a second side along a second direction perpendicular to both the thickness direction of the substrate and the first direction,
    the first pad has a first base portion in contact with both the first side and the second side of the substrate main surface, and a first pad portion having one end connected to the first base portion,
    the first pad portion of the first pad extends from the first base portion toward the first die pad, obliquely with respect to both the first direction and the second direction,
    the second pad has a second base portion in contact with the first side of the substrate main surface, and a second pad portion having one end connected to the second base portion, and
    the second pad portion of the second pad extends along the second direction.

2. The LED package of claim 1, wherein the first wire is disposed along a direction in which the first pad portion of the first pad extends, when viewed in the thickness direction of the substrate.

3. The LED package of claim 1, wherein the first die pad has a circular shape when viewed in the thickness direction of the substrate.

4. The LED package of claim 1, wherein the first LED chip has a first chip back surface facing a side opposite to the first chip main surface in the thickness direction of the substrate, and
    wherein the first chip back surface is mounted on the first die pad via a first bonding layer having conductivity.

5. The LED package of claim 1, wherein the second wire is disposed along the first wire when viewed in the thickness direction of the substrate.

6. The LED package of claim 1, wherein the second die pad has a rectangular shape when viewed in the thickness direction of the substrate.

7. The LED package of claim 6, wherein the main surface electrode further includes a first connection wiring connecting the second pad and the second die pad,
    wherein the first connection wiring has a first extending portion having one end extending from the second base portion of the second pad along the first direction, and a second extending portion extending from the other end of the first extending portion to one side of the second die pad along the second direction.

8. The LED package of claim 6, wherein the first electrode pad is disposed close to an edge of the second LED chip when viewed in the thickness direction of the substrate, and
    wherein the second die pad has a main pad portion on which the second LED chip is mounted, and a sub pad portion which is integrally formed with the main pad portion and projects from the main pad portion in a direction from the center of the second LED chip to the center of the first electrode pad when the thickness direction of the substrate.

9. The LED package of claim 1, wherein the main surface electrode further includes a third pad separated from both the first pad and the second pad, and
    wherein the second LED chip has a second electrode pad which is formed on the second chip main surface and is separated from the first electrode pad,
    the LED package further comprising a third wire which is disposed along the second wire when viewed in the thickness direction of the substrate and connects the third pad and the second electrode pad.

10. The LED package of claim 9, wherein the second LED chip has a second chip back surface facing a side opposite to the second chip main surface in the thickness direction of the substrate, and wherein the second chip back surface is mounted on the second die pad via a second bonding layer having electrical insulation.

11. The LED package of claim 9, wherein the substrate main surface has a third side along the second direction, the third side being positioned on a side opposite to the second side in the first direction, and wherein the main surface electrode further includes a second connection wiring having a third base portion in contact with both the first side and the third side of the substrate main surface, a first branch portion which is disposed along the second direction and connects the third base portion and the third pad, and a second branch portion which is disposed along the first direction and connects the third pad and the first die pad.

12. The LED package of claim 1, further comprising a housing which is mounted on the substrate main surface and surrounds the first LED chip and the second LED chip, wherein the housing is filled with transparent sealing resin.

13. The LED package of claim 12, wherein the main surface electrode includes a Cu layer in contact with the substrate main surface, and an Ag layer laminated on the Cu layer.

14. The LED package of claim 1, wherein two second LED chips are provided, and wherein the first LED chip emits red light, one of the two second LED chips emits blue light, and the other second LED chip emits green light.

15. The LED package of claim 1, further comprising:
a back surface electrode disposed on the substrate back surface; and
a through-electrode connecting the main surface electrode and the back surface electrode, wherein the through-electrode is disposed along a through-groove which penetrates through the substrate and intersects an edge of the first base portion of the first pad.

16. A light emitting element package comprising:
a substrate including a first surface facing a first direction, and a first side and a second side intersecting the first side when viewed in the first direction;
a first electrical conduction part formed on the first surface of the substrate;
a second electrical conduction part formed on the first surface of the substrate and separated from the first electrical conduction part, the second electrical conduction part including:
a first portion connected to the first side and the second side; and
a second portion connected to the first portion and extending along a direction that intersects a second direction parallel to the first side and a third direction parallel to the second side;
a first LED arranged on the first electrical conduction part; and
a first wire which connects a center portion of the first LED and the second portion of the second electrical conduction part, and extends along a direction that intersects the second direction and the third direction, when viewed in the first direction.

17. The light emitting element package of claim 16, further comprising a first recess portion that penetrates through the substrate when viewed in the first direction, and is connected to the first side and the second side, wherein the first portion at least partially surrounds the first recess portion when viewed in the first direction.

18. The light emitting element package of claim 16, further comprising:
a third electrical conduction part formed on the first surface of the substrate;
a fourth electrical conduction part formed on the first surface of the substrate and separated from the third electrical conduction part, the fourth electrical conduction part including:
a third portion connected to the second side; and
a fourth portion connected to the third portion and extending along the second direction;
a second LED arranged on the third electrical conduction part; and
a second wire connecting the second LED and the fourth portion of the fourth electrical conduction part.

19. The light emitting element package of claim 18, wherein the second wire is disposed along the first wire when viewed in the first direction.

20. The light emitting element package of claim 18, further comprising a second recess portion that penetrates through the substrate when viewed in the first direction, and is connected to the second side, wherein the third portion at least partially surrounds the second recess portion when viewed in the first direction.

* * * * *